United States Patent [19]

Kunz

[11] Patent Number: 4,670,716
[45] Date of Patent: Jun. 2, 1987

[54] NMR TOMOGRAPHY APPARATUS

[75] Inventor: Dietmar W. Kunz, Hamburg, Fed. Rep. of Germany

[73] Assignee: U.S. Philips Corporation, New York, N.Y.

[21] Appl. No.: 715,422

[22] Filed: Mar. 25, 1985

[30] Foreign Application Priority Data

Mar. 27, 1984 [DE] Fed. Rep. of Germany ....... 3411222

[51] Int. Cl.⁴ ............................................. G01R 33/20
[52] U.S. Cl. ..................................... 324/309; 324/320
[58] Field of Search ............... 324/300, 307, 309, 318, 324/319, 320, 322

[56] References Cited

U.S. PATENT DOCUMENTS 3,406,333 10/1968 Nelson ................................. 324/320
4,480,228 10/1984 Bottomley ............................ 324/309

Primary Examiner—Michael J. Tokar
Attorney, Agent, or Firm—Robert T. Mayer; Algy Tamoshunas

[57] ABSTRACT

The invention relates to an MR tomography apparatus, comprising three coil systems for generating a magnetic field which extends in the direction of a steady, homogeneous main field and which varies linearly as a function of the location. In addition, there is provided at least one further coil system which generates a magnetic field which also extends in the direction of the homogeneous magnetic field but which varies non-linearly as a function of the location. The coil systems are supplied with a current which is always proportioned so that the superposition of the magnetic fields of the coil systems produces the desired variation in time and space of the magnetic flux density of the steady field. The effect of eddy currents or other inaccuracies can then be reduced by the additional coil system.

3 Claims, 2 Drawing Figures

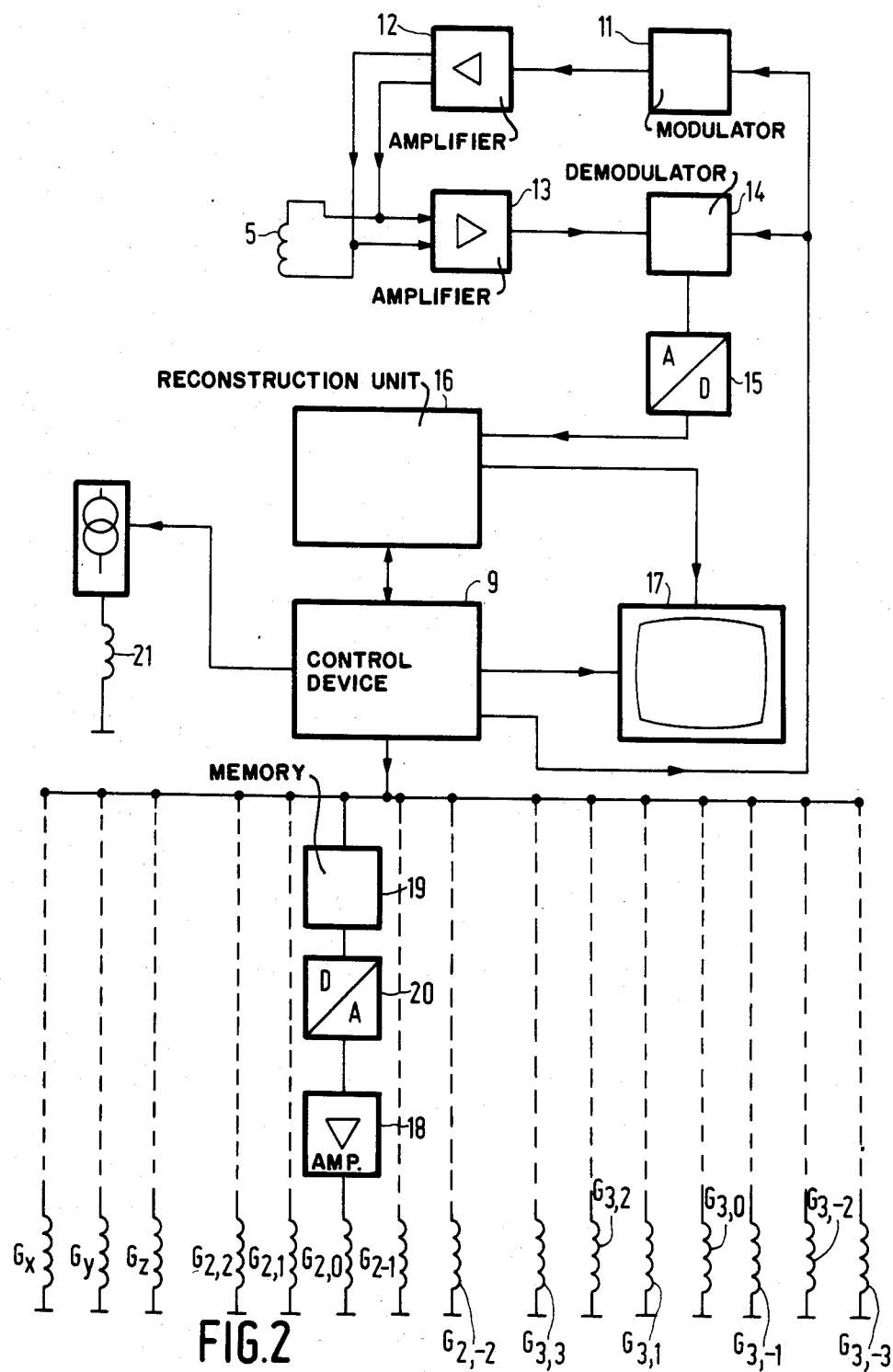

NMR TOMOGRAPHY APPARATUS

The invention relates to a MR magnetic resonance tomography apparatus, comprising an arrangement for generating a homogeneous steady magnetic field, three coil systems through which time varying currents flow. Those coil systems serve to generate additional magnetic fields which extend in the direction of the steady magnetic field and which vary linearly in three mutually perpendicular directions. Such as apparatus also comprises an RF coil for generating an RF magnetic field perpendicularly to the direction of the steady field, the magnetic flux density of the homogeneous steady magnetic field being varied in space and in time in a defined manner by superposition of a further magnetic field.

Such an MR tomography apparatus is known, for example from DE OS 28 49 355 where, for the sake of clarity, it is shown in a partly broken-away view in FIG. 1. The NMR tomography apparatus comprises an arrangement for generating a strong, homogeneous steady magnetic field which extends in the z-direction of an xyz system of coordinates. This arrangement consists of four concentric, annular coils 1 whose central axis extends in the z-direction. Inside these coils the magnetic field is homogeneous in a comparatively large zone (the examination zone) and has a flux density of between 0.1 T and 2 T; the higher flux densities must usually be obtained by means of a superconducting coil system. A patient 4 to be examined is introduced into the examination zone on a patient table 2 which comprises a top 3 which is displaceable in the z-direction.

The NMR tomography apparatus also comprises three coil systems for generating magnetic fields which extend in the z-direction and which vary linearly in space in the x-, the y- and the z-direction. These coil systems are generally referred to as "gradient coils" in the literature. The coil system for generating a magnetic field which extends and linearly decreases in the z-direction consists of at least two similar coils Gz which are arranged so as to be staggered with respect to one another in the z-direction and symmetrically with respect to the coils 1. Between the coils Gz, a magnetic field is generated which extends in the z-direction and which varies linearly as a function of the location in this direction when a current flows through these coils in opposite directions.

The coil system for generating another magnetic field which also extends in the z-direction but which varies linearly in space in the x-direction consists of four similar coils Gx. These approximately rectangular coils are arranged on the circumference of a circular cylinder whose center line extends parallel to the y-axis and passes through the center of the rings 1 and hence the examination zone. Currents of the same value flow through the four coils Gx. The currents are directed so that in neighbouring coils the respective parts which face the other coil and which extend in the y-direction, conduct current in the same direction.

The coil system Gy for generating a magnetic field which extends in the z direction and which varies linearly in the y-direction as a function of the location has a construction which is identical to that of the coil system Gx, be it that it has been rotated through 90° with respect thereto. This means that this coil system also consists of four rectangular coils Gy which are arranged on the circumference of a circular cylinder. The central axis of this circular cylinder, however, extends parallel to the x-axis through the center of the examination zone. The magnetic field produced by the coil systems Gx and Gy has the flux density zero in the symmetry axis extending in the z-direction.

Finally there is provided an RF coil 5 which generates a homogeneous RF magnetic field in the examination zone. The frequency of the RF field corresponds to the Larmor frequency of the precessional motion of the nuclear spins about the z-axis in the examination zone.

In customary operation, of such an NMR tomography apparatus, the nuclear spins are excited in a slice of the object to be examined. To this end, the gradient coils Gz are energized by a current during the excitation of the nuclear spins by the RF coil 5, so that the magnetic field generated by the coils 1 and Gz varies linearly from one coil Gz to another. Consequently, the nuclear spins are excited in the slice whose Larmor frequency (as is known, the Larmor frequency is proportional to the magnetic field strength) corresponds to the frequency of the RF field. Subsequently, the coils Gx and Gy are energized so that the magnetic field inside the slice changes in the x-direction or the y-direction, respectively (usually successively or phase-shifted in time). As a result, the phases and the amplitude of the signal induced in the coil 5 after the excitation are influenced so that the nuclear spin distribution in the excited slice can be reconstructed.

The reconstruction quality is influenced by the fact that the gradient fields do not exhibit exactly the predetermined variation in space, for example they do not vary exactly linearly as a function of the location. Moreover, this deviation from the predetermined variation is time-dependent. This phenomenon is caused by the eddy currents which occur when the currents through the gradient coils are switched on and which produce magnetic fields which may deviate from the field of the coil as regards their spatial dependency.

In order to mitigate these effects it is known to impose a variation in time on the current through the gradient coils which deviates from the desired variation in time of the magnetic field. For example, when the magnetic field of a gradient coil is to be abruptly switched to a given value, a current is applied to this gradient coil which exceeds its stationary value on the switch-on edge. Therefore, this step has only limited success.

It is the object of the present invention to reduce the effect of the eddy currents occurring when the gradient coils are energized and the effects of other inaccuracies on the variation in space of the magnetic fields.

This object is achieved in accordance with the invention in that there is provided at least one further coil system for generating a magnetic field which also extends in the direction of the steady field and which varies non-linearly in space. The variation in time of the currents through that further coil systems is proportioned so that the defined variation in time and space of the magnetic flux density is obtained by superposition of the magnetic fields of all coil systems.

The deviations from the desired variation in time and space can usually be only partly eliminated when use is made of a single further coil system. These deviations depend on the one hand on the actual construction of the NMR apparatus and on the other hand also on the extent and the cause of the deviations from the desired variation. For example, the deviations caused by the occurrence of eddy currents are themselves determined by the variation in time of the energizing of the gradient coils. The eddy currents are more pronounced as the energizing function of the gradient coils contains higher frequency components.

In one embodiment of the invention, up to five additional coil systems are provided in order to generate magnetic fields whose variation in space corresponds to the variation in space of second-order spherical functions.

This elaboration is based on the following considerations. Any arbitrary magnetic field, including the magnetic field generated by the gradient coils and the magnetic field produced by the associated eddy currents, can be represented as a weighted sum of spherical functions of the zeroth, first, second, third ... order, the number of orders in principle being infinite. However, the magnetic field components which vary according to higher-order spherical functions are generally negligible. Because the magnetic field of the gradient coils varies in time, the weighting factors of the individual spherical functions participating in said weighted sum also vary in time. The five additional coil systems, each of which corresponds to one of the five second-order spherical functions, the gradient coils (Gx, Gy, Gz) each of which corresponds to a first-order spherical function, and the coil system (1) for the steady magnetic field thus enable a magnetic field to be generated which exhibits an arbitrary variation in space (ignoring components corresponding to the third or higher harmonics of the spherical functions) when the contribution by the individual coils is suitably weighted. A desired variation in time can thus be obtained by suitable variation of the weighting factors for the contribution of the individual coils to the resultant magnetic field, i.e. the currents through these coils.

A further embodiment is based on similar considerations. In this further version, up to seven further coil systems are provided in order to generate a magnetic field whose variation in space corresponds to the variation in space of third-order spherical functions. the deviations from the desired variation in time and space can thus be even better compensated for, because third-order deviations can also be compensated for.

It is to be noted that the desired variation in space and time of the magnetic field cannot be exactly obtained by means of the invention. However, the deviations from this desired variation are reduced by the additional coil system (systems).

The invention will be described in detail hereinafter with reference to the drawing. Therein:

FIG. 2 shows a block diagram of an MR tomography apparatus in accordance with the invention.

Figure 1:
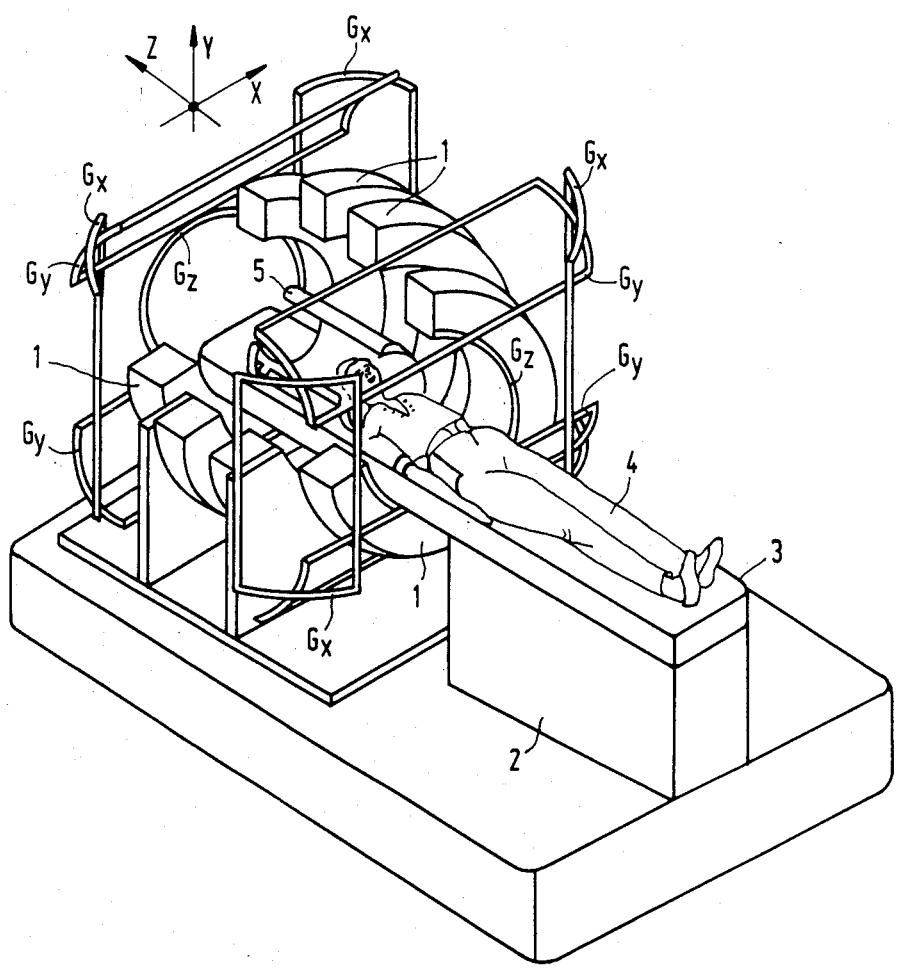
FIG. 1 shows a known MR tomography apparatus.

The apparatus shown in FIG. 2 comprises a control device 9 which controls, inter alia, a modulator 11. The modulator 11 produces a carrier oscillation which is applied to the RF coil 5 via a power amplifier 12. The frequency of the modulated oscillation, as well as the intensity of the magnetic field generated by the coils 1, are adapted to one another so that nuclear spin resonance is excited in a slice of the body 4 being examined. After the excitation, the signals induced in coil 5 are applied to a phase-sensitive demodulator 14 via an amplifier 13. The output signal of demodulator 14 is converted into a digital data word by an analog-to-digital converter 15 in order to be applied to a reconstruction unit 16. On the basis of the data received, this unit determines the spatial distribution of the nuclear spins in the excited slice by means of a predetermined algorithm, said distribution being displayed, for example, on a monitor 17.

The control unit 9 also controls the current through the gradient coils Gx, Gy and Gz which generate a magnetic field which extends in the z-direction and which varies linearly in the x, the y and the z-direction, respectively. The arrangement described thus far is also known. However, in accordance with the invention there are provided twelve additional coil systems. Each system consists of several individual coils which are symmetrically arranged with respect to the center of the examination zone so that the magnetic field which is generated thereby and which extends in the z-direction varies symmetrically with respect to this center, that is to say either as a squarelaw or cubic function of the distance from the center. Five of the twelve coil systems, i.e. the coil systems $G_{2,2} \ldots G_{2,-2}$, generate magnetic fields whose flux density is proportional to one of the five second-order spherical functions, while the magnetic flux density of the other seven coils ($G_{3,3} \ldots G_{3,-3}$) varies each time proportionally to one of the seven third-order spherical functions. The variation in space of the magnetic field generated by a coil $G_{l,m}$ is then at least substantially proportional to a spherical function $f_{l,m}$, l being between 2 and 3 and m being between $+3$ and $-3$ in the present example. The spherical function $f_{l,m}$ is defined as follows $$f_{l,m} = \begin{cases} r^l P_{l,m}(\cos a) \cdot \cos mb & \text{for } m \geq 0 \\ r^l P_{l,-m}(\cos a) \cdot \sin(-mb) & \text{for } m < 0 \end{cases} \quad (1)$$

Where, r is the distance of a point from the coordinate origin which coincides with the center of the examination zone, a is the angle enclosed by the straight line between the coordinate origin and the point with respect to the z-axis, b is the angle enclosed by the projection of this straight line on a plane z=constant with respect to the x-axis, and $P_{l,m}(..)$ is the $m^{th}$ derivative of the Legendre polynomial of the straight line 1 according to its argument $(..)$, $P_{l,m}(..)$, $P_{l,m}(..)$ corresponding to the Legendre polynomial of the straight line 1 for m=0. Because only 1 derivatives of a Legendre polynominal deviate from zero in accordance with its argument, and because sin mb becomes zero for m=0, there will be only 2l+1 spherical functions of the order 1, i.e. five second-order spherical functions (2×2+1) and seven third third-order spherical functions (2×3+1).

U.S. Pat. No. 3,566,255 offers a detailed description of the construction of coil systems whose magnetic field varies essentially in proportion to a spherical function. The coils $G_{2,2} \ldots G_{2,-2}$ correspond to the coils shown in the FIGS. 3 to 7 of said patent, while the construction of the coils $G_{3,3} \ldots G_{3,-3}$ is as shown in the FIGS. 9 to 15. The calculation and the design of such coils is also described in "The Review of Scientific Instruments", Vol. 32, No. 3, pages 241 to 250.

As shown in FIG. 2, the current for the coil $G_{2,0}$ is supplied by a power amplifier 18 having a sufficiently high output resistance. The input signal for the power amplifier originates from a function generator which consists of a memory 19 which is followed by a digital-to-analogue converter 20. The memory 19 stores a multitude of data words whose sequence corresponds to the variation in time of the current through the coil $G_{2,0}$. The data words in the memory 19 are read under the control of the control device 9, converted into an analog signal by the digital-to-analog converter 20 and applied to the input of the amplifier 18 via a suitable low-pass filter. The amplifier 18 generates a current whose variation in time corresponds to the sequence of the data words stored in the memory 19. The current for all other coil systems, including the coils Gx, Gy, Gz, is supplied by identically constructed devices 18 . . . 20 which, however, are not shown in FIG. 2. The only difference is that different sequences of data words are stored in the memories associated with the individual coil systems, because the currents through these coils vary differently in time. The variation in time of the currents through the individual coils, i.e. the sequence of the data words in the the memory 19, is chosen so that the linear superposition of the magnetic fields generated by the individual coil systems produces exactly the desired variation in time and space of the magnetic field.

This variation in time and space may include a first phase during which the magnetic field varies linearly in space in the z-direction for a predetermined period of time (thus fixing the position of the slice whose nuclear spin distribution is to be subsequently measured). During a subsequent phase, a gradient of the magnetic field which is constant in time and space is generated, for example in the y-direction, for a predetermined period of time, while during a third phase a gradient of the magnetic flux density which is constant in space and time is generated in the x-direction for a predetermined period of time. During each of the three phases not only the relevant gradient coil system is energized (during the second phase, for example the coil system Gy) but usually also all other coil systems, including the other gradient coil systems (Gx, Gz).

A description will now be given of a method of determining the variations in time of the currents in the various coils or the sequence of the data words in the various memories associated with these coils. This method comprises the following steps:

(1) A sinusoidal current is applied to each one of the coils. The intensity and phase of the resultant magnetic field is measured at a point which is situated inside the coil system at the distance r from the coordinate origin, i.e. from the center of the examination zone. (The phase is measured with reference to the phase of the alternating current in the coil). This measurement is repeated for different frequencies. The frequencies are chosen so that they correspond to the spectral range resulting from the energizing of the gradient coil systems. The described measurements are performed for N points on the surface of the sphere having the radius r, for which:

$$N = (l_0 + 1)^2 \tag{2}$$

Where, $l_0$ is the highest order of the spherical functions which can be generated completely and independently of one another by the coil systems. Thus, in the embodiment shown in FIG. 2, $l_0$ equals 3 so that a measurement must be performed at a total of 16 different points on the sphere surface. The various measurements are repeated for all coil systems.

The magnetic flux density B measured at one point for one coil and for one frequency can be represented as a weighted sum of spherical functions in accordance with the following equation:

$$B = \sum_{l=0}^{l_0} \sum_{m=-l}^{+l} a_{l,m} \cdot f_{l,m} \tag{3}$$

Where, $f_{l,m}$ is the spherical function, defined for the relevant point on the basis of the equation (1), i.e. a numerical value which can be calculated or derived from tables, while $a_{l,m}$ represents the associated weighting factor which generally comprises a real and an imaginary component, because the variable B generally also comprises a real and an imaginary component. Because a total number of 16 (N) spherical functions exists between the order zero and the third order ($l_0$), the weighted sum also comprises 16 weighting factors $a_{l,m}$ in accordance with equation (3). Because the magnetic flux density was measured at 16 (N) different points on the spherical surface for the same coil system and for the same frequency, 16 linear equations are obtained for the 16 unknowns $a_{l,m}$. From these equations, the 16 weighting factors $a_{l,m}$ can be calculated in accordance with known methods. This calculation is repeated for the various measurement frequencies. For each frequency, weighting factors $a_{l,m}$ can be obtained which deviate from the weighting factors previously measured. A set of possibly frequency-dependent factors $a_{l,m}$ is thus obtained, said factors completely describing the properties of the coil system up to the third harmonic or up to third-order spherical functions. This set of weighting factors represents an N-dimensional vector whose individual components ($a_{l,m}$) are frequency-dependent.

The same calculation is also performed for all other coils, so that for each coil an N-dimensional vector is obtained, the different factors $a_{l,m}$ in all vectors being arranged in the same sequence. Such a vector is also formed for the coil system generating the magnetic field which is constant in space and usually also in time. Two possibilities then exist:

(a) For the coil 1 a vector is defined where all components have the value zero with the exception of the component $a_{00}$ which is fixed at an arbitrary, frequency-independent value. However, corrections are then required for the measurement of the nuclear spin distribution.

(b) Use is made of a second coil system which is not shown in FIG. 2 and which generates a magnetic field which extends in the z-direction and which is also constant in space. However, this magnetic field is substantially weaker than the steady magnetic field and the current through these coils is variable in time and is generated in the same way as the current through all other coils.

Thus, for all 16 (N) coil systems there is obtained a vector which comprises each time 16 (N) components $a_{l,m}$. These vectors are combined as column vectors in order to form a matrix, the individual column vectors being arranged so that the dominating component is situated on the main diagonal of the matrix. The matrix thus obtained is referred to hereinafter as A(w), w indicating the frequency-dependency the matrix elements.

(2) The matrix A(w) is inverted, which results in a matrix $A^{-1}(w)$. As is known, the product of a matrix and its inverted form represents a unit matrix, i.e. a matrix in which all elements of the main diagonal have the value 1, while all other elements are 0. It is a further property of the inverted matrix that the indications of columns and rows are interchanged. Therefore, if the seventh column vector was associated with the coil $G_{2,0}$ in the matrix A, the seventh row vector will be associated therewith in the inverted matrix $A^{-1}$.

(3) The desired variation in time and space of the magnetic field Bg is determined in the examination zone for a multitude of different instants and for each instant a weighted sum of spherical functions is formed in accordance with the equation $$Bg = \sum_{l=0}^{l_0} \sum_{m=-l}^{+l} c_{l,m} \cdot f_{l,m} \quad (4)$$

Where, $c_{lm}$ is the weighting factor of the spherical function $f_{l,m}$ participating in the weighted sum. Consequently, again an N dimensional vector is obtained which comprises the time-dependent elements $c_{lm}$. When the magnetic field is to vary, for example linearly in space, only those components of this vector for which l=1 will deviate from zero.

(4) The individual, time-dependent components $c_{lm}(t)$ are transformed from the time domain to the frequency domain by means of a Fourier transformation, thus forming a vector D(w) comprising N frequency-dependent components $d_{lm}1(w)$.

(5) The resultant vector D(w) is multiplied by the inverted matrix $A^{-1}(w)$. This results in an N-dimensional vector I(w).

(6) The N components of the vector I(w) are transformed into the time domain. The component $i_j(t)$ (j=1 ... N) of the vector transformed into the time domain then represents the variation in time of the current which must flow through the coil system with which there is associated the $j^{th}$ column vector of the matrix A or the $j^{th}$ row vector of the matrix $A^{-1}$.

(7) The current variations associated with the individual coils are converted into a corresponding sequence of data words which are written into the memory 19 associated with the relevant coil system.

Once the variation in time of the currents through the individual coils has been determined in this manner, the data words stored in the memories 19 can each time be fetched again for generating the magnetic field which extends in the z-direction and which varies as a predetermined function of location and time. This also holds good for other NMR tomography apparatus of the same type, provided that it is ensured that the manufacture of the NMR tomography apparatus and its erection site do not influence the magnetic fields generated thereby.

When a different variation in time and space is desired, it will merely be necessary to perform the described steps (3) to (7) again. It is also possible to produce variations such that the magnetic flux density varies, for example squarelaw as a function of the location as described in German Patent Application P 34 00 861.6. In that case the factors $c_{lm}$ would deviate from zero only for l=2. Should the calculation reveal that the current through one of the coil systems is substantially equal to zero also for different variations in time and space, the relevant coil system can be omitted.

It is not absolutely necessary for the variation in space of the magnetic flux density of the magnetic field generated by a coil system to correspond at least approximately to the variation in space of only one spherical function. The invention is notably effective also when the variation of the magnetic fields corresponds to a linear combination of spherical functions. However, in that case the number of coils required would not change. It is notably important, however, that the magnetic field of a coil is clearly distinct from that of any other coil as regards the type of variation (for example, linear, squarelaw, cubic) and/or the direction in which this variation takes place. Otherwise small errors in the determination of the matrix A could falsify the current variations calculated for the various coil systems to a substantial degree.

It follows from the described calculation method that the currents through all coil systems must exhibit the calculated variations in time and not only through the additional coils $G_{2,2} \ldots G_{3,-3}$. This means that at a given instant, for example the coil $G_y$ which generates a constant gradient of the magnetic field in the y-direction can usually also conduct a current in which only a constant gradient in the x-direction is desired. This is due to the fact that the eddy currents occurring when the current through the coil system $G_x$ is switched on also generate magnetic fields which vary linearly in the y-direction. The calculation may also reveal that it will also be necessary to generate a magnetic field which extends in the z-direction and is constant in space but variable in time. When an additional coil is available for these purposes (alternative b), The generating of such a magnetic field will not be problematic. However, if no such coil is available, the following remedy can be used when the errors caused by this absence are not acceptable.

The frequency at which the nuclear spins are excited by the RF coil is varied in proportion to the calculated current variation. Thus, the spins are always excited only in the slice which would occur if the frequency were constant and if the homogeneous magnetic field were not variable. Furthermore, the deviation of the homogeneous component of the magnetic field from its steady value causes a phase shift of all spins of the excited slice. The phase shift appears as a time integral of this deviation. However, because this phase shift is the same for all spins, it can be taken into account during the processing of the signal induced in the coil 5 by the nuclear spins in such a way that the measurement results will not be falsified thereby.

What is claimed is:

1. An MR tomography apparatus comprising means for generating a homogenous steady magnetic field in an examination space, three coil systems arranged so as to generate, in said examination space, additional magnetic fields which extend in the direction of the steady magnetic field and which vary linearly in three mutually perpendicular directions, means for generating, in said examination space, an RF magnetic field which is perpendicular to the direction of said steady magnetic field, and at least one further coil system arranged to generate, in said examination space, a further magnetic field which extends in the direction of said steady magnetic field and which varies non-linearly in space so as to compensate for variation in the resultant magnetic field in said examination space caused by eddy currents in said coils of said coil systems.

2. The apparatus according to claim 1 comprising up to five of said further coil systems each generating, in said examination space, a magnetic field whose variation in space corresponds to the variation in space of a second order spherical function.

3. The apparatus according to claim 2, comprising up to seven of said further coil systems each generating a magnetic field whose variation in space corresponds to the variation in space of a third order spherical function.

* * * * *